(12) United States Patent
Koors et al.

(10) Patent No.: US 6,180,436 B1
(45) Date of Patent: Jan. 30, 2001

(54) METHOD FOR REMOVING HEAT FROM A FLIP CHIP SEMICONDUCTOR DEVICE

(75) Inventors: Mark Anthony Koors, Kokomo; Glen W Devos, Fort Wayne, both of IN (US)

(73) Assignee: Delco Electronics Corporation, Kokomo, IN (US)

(*) Notice: Under 35 U.S.C. 154(b), the term of this patent shall be extended for 0 days.

(21) Appl. No.: 09/072,593

(22) Filed: May 4, 1998

(51) Int. Cl.$^7$ ........................................... H01L 21/48
(52) U.S. Cl. ........................ 438/117; 438/121; 438/122
(58) Field of Search .................................. 257/707, 713, 257/722, 732, 704, 706, 710, 712, 778, 779; 438/108, 121, 122, 106, 117, FOR 413; 361/697, 709, 711

(56) References Cited

U.S. PATENT DOCUMENTS

| 4,092,697 | * | 5/1978 | Spaight | 361/386 |
| 4,654,966 | * | 4/1987 | Kohara et al. | 29/840 |
| 4,765,400 | * | 8/1988 | Chu et al. | 165/185 |
| 5,291,064 | * | 3/1994 | Kurokawa | 257/714 |
| 5,396,403 | * | 3/1995 | Patel | 361/705 |
| 5,523,260 | * | 6/1996 | Missele | 438/118 |
| 5,724,729 | * | 3/1998 | Sherid et al. | 29/840 |
| 5,751,062 | * | 5/1998 | Daikoku et al. | 257/722 |
| 5,956,576 | * | 9/1999 | Toy et al. | 438/125 |
| 5,981,310 | * | 11/1999 | DiGiacomo et al. | 438/106 |

FOREIGN PATENT DOCUMENTS

2246472 * 8/1989 (GB).

* cited by examiner

Primary Examiner—Olik Chaudhuri
Assistant Examiner—Alonzo Chambliss
(74) Attorney, Agent, or Firm—Jimmy L. Funke

(57) ABSTRACT

A method and assembly (10) for conducting heat from a semiconductor device, such as a power flip chip (12). The assembly (10) is generally constructed to dissipate heat from the chip (12) when mounted to a flexible substrate (16). Heat is conducted from the chip (12) with a heat-conductive member (26) brought into thermal contact with the surface of the chip (12) opposite solder bump connections (18) that attach the chip (12) to the substrate (16). A biasing member (30) biases the substrate (16) against the chip (12) so as to maintain thermal contact between the chip (12) and the heat-conductive member (26). A thermally-conductive lubricant (32) is preferably provided between the surface of the chip (12) and the heat-conductive member (26) in order to promote thermal contact while also decoupling any lateral mechanical strains that may arise as a result of different thermal expansions and movement between the chip (12), substrate (26) and heat-conductive member (26). The substrate (16) and chip (12) are preferably enclosed within a housing (14) that incorporates the heat-conductive member (26). The housing (14) may further include fins (28) in order to promote heat dissipation from the housing (14) to the environment.

6 Claims, 1 Drawing Sheet

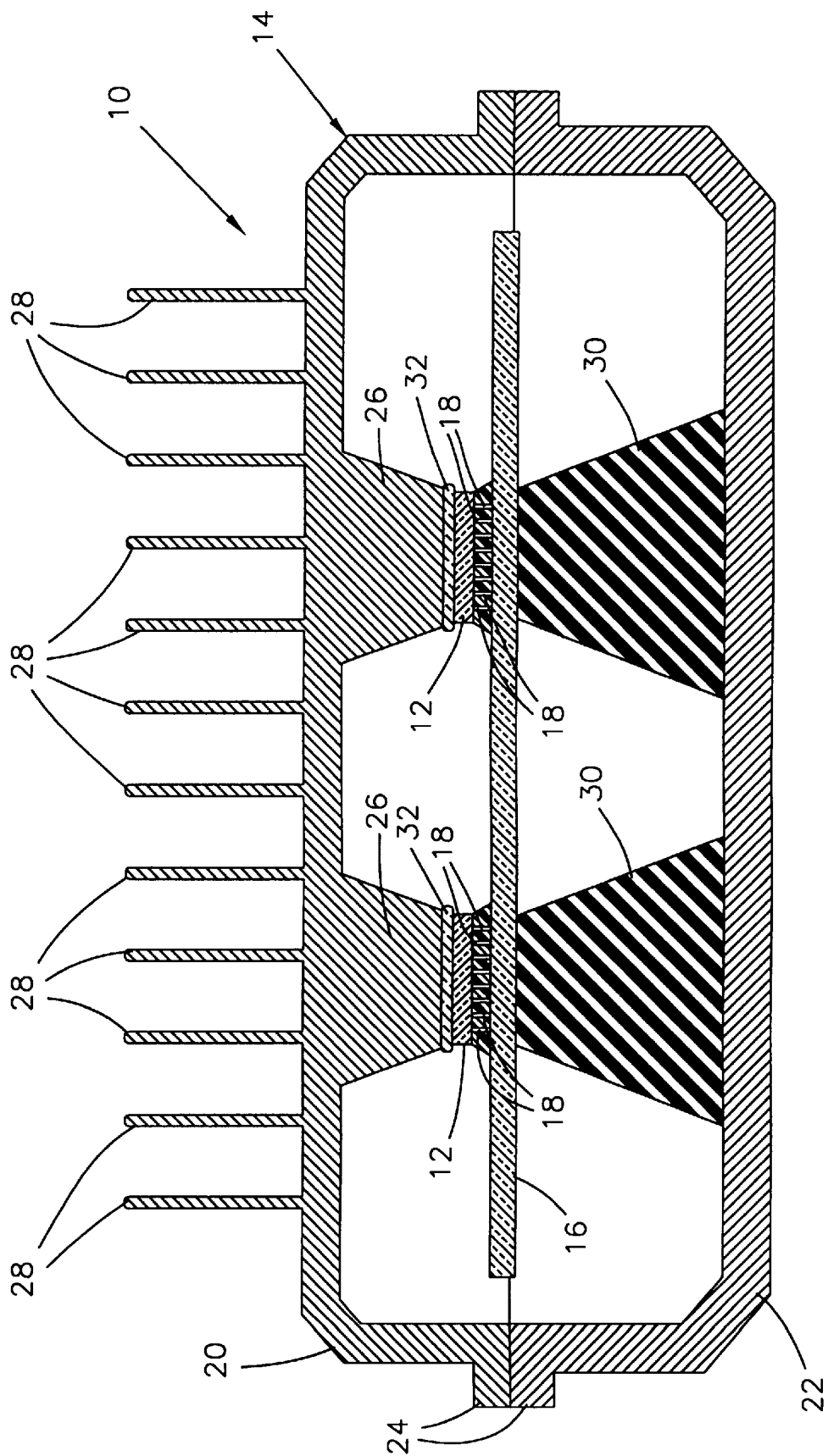

METHOD FOR REMOVING HEAT FROM A FLIP CHIP SEMICONDUCTOR DEVICE

FIELD OF THE INVENTION

The present invention generally relates to flip chip semiconductor devices. More particularly, this invention relates to a method of conducting and dissipating heat from flip chips for purposes of thermal management of such devices, and to a heat-conducting structure for this purpose.

BACKGROUND OF THE INVENTION

A variety of methods are known for dissipating heat generated by semiconductor devices. Such methods typically entail the use of a thermally-conductive substrate, such as beryllium oxide (BeO), or a substrate modified to promote its heat-conduction capability. Significant disadvantages with the use of BeO substrates include the relatively high cost of manufacture and the toxic nature of BeO. In the case of a substrate modified to promote its thermal conductivity, thermal management is usually achieved by dissipating heat primarily in the vertical, or "z" direction, beneath the semiconductor device. For example, heat-generating semiconductor chips, such as power flip chips, are often mounted to alumina substrates that conduct and dissipate heat in the vertical direction away from the chip. These designs are limited in their ability to dissipate heat laterally, i.e., in the "x" and "y" directions, because the thermal conductivity of alumina is low compared to metals and metal-containing materials.

Another approach to dissipating heat from power semiconductor devices entails the use of ultra-thick thick films (UTTF), as taught in U.S. Pat. No. 5,527,627 to Lautzenhiser et al. Whereas conventional thick films are generally limited to thickness of up to about 0.001 inch (about 25 micrometers), Lautzenhiser et al. teach an ultra-thick thick film conductor having a thickness of about 0.005 inch (about 125 micrometers) or more, and therefore more capable of conducting heat laterally, in the x and y directions, from a heat-generating semiconductor device. However, the use of ultra-thick thick-film conductors is not always practical, as is the case when the heat-generating device is a flip chip, and particularly power flip chips that operate at power levels of 5 watts and higher.

SUMMARY OF THE INVENTION

It is an object of this invention to provide a method for conducing heat from a flip chip semiconductor device mounted to a substrate.

It is another object of this invention that the method entails a structure that thermally contacts a surface of the flip chip, such that heat generated by the chip is conducted away from the chip and the substrate to which the chip is mounted.

In accordance with a preferred embodiment of this invention, these and other objects and advantages are accomplished as follows.

According to the present invention, there is provided a method and assembly for conducting heat from a flip chip semiconductor device, and particularly a power flip chip. The assembly is generally constructed to dissipate heat from a flip chip mounted to a flexible substrate, such as a laminate or a printed wiring board. The flip chip has solder bumps on a first surface registered with conductors on the substrate, and a second surface oppositely disposed from the first surface. Heat is conducted from the flip chip with a heat-conductive member brought into thermal contact with the second surface of the flip chip. The substrate is biased against the flip chip so as to maintain thermal contact between the flip chip and the heat-conductive member. A thermally-conductive lubricant is preferably provided between the second surface of the flip chip and the heat-conductive member. The lubricant serves to fill gaps between the flip chip and heat-conductive member in order to promote thermal contact, while also serving to decouple any lateral mechanical strains that may arise as a result of different thermal expansions and movement between the flip chip, substrate and heat-conductive member.

In a preferred embodiment, the substrate and flip chip are enclosed within a housing that incorporates the heat-conductive member, which may be a pedestal projecting into the interior of the housing. With such a structure, a biasing member such as a spring or elastomeric member can also be enclosed in the housing, such that the housing supports the biasing member to maintain the biasing member in contact with the substrate, and therefore the flip chip in contact with the heat-conductive member. The housing may further include convection cooling fins in order to promote heat dissipation from the housing to the surrounding environment.

From the above, one can see that the heat-conducting assembly of this invention provides an uncomplicated method for dissipating heat from a flip chip. Instead of relying on heat conduction through the substrate via the flip chip solder bumps, as conventionally done, the present invention conducts heat away from the chip through the back side of the chip, i.e., the surface of the chip opposite the surface on which the flip chip microcircuitry is formed. The heat-conductive member serves both as a conductive path from the flip chip and a heat sink, the latter being promoted if the heat-conductive member is in the form of a pedestal, and particularly a pedestal formed as an interior projection of a housing.

Other objects and advantages of this invention will be better appreciated from the following detailed description.

BRIEF DESCRIPTION OF THE DRAWINGS

The present invention will now be described, by way of example, with reference to the accompanying FIGURE which shows, in accordance with this invention, a housing that encloses a pair of flip chips mounted to a substrate, and heat-conductive features that conduct heat away from the flip chips.

DETAILED DESCRIPTION OF THE INVENTION

The FIGURE shows a heat-dissipating assembly 10 for a pair of power flip chips 12. The assembly 10 includes a housing 14 that encloses the flip chips 14 and a flexible substrate 16 on which the flip chips 12 are mounted. Mounting of the flip chips 12 to the substrate 16 can be performed by conventional flip-chip techniques, in which preformed solder bumps on the front side of the chips 12 (the surface of the chips 12 on which the flip chip microcircuitry is formed) are registered with and reflow soldered to conductors (not shown) on the surface of the substrate 16 to yield solder connections 18 shown in the FIGURE. The chips 12 are shown as being underfilled with a suitable polymeric material, as is conventionally done in the art to promote the thermal cycle life of the solder connections 18. According to the invention, the substrate 16 is preferably flexible for reasons to be discussed below. Suitable substrates include thin laminates and printed wiring boards (PWB), both of which are well known in the art.

The housing 14 is shown as being composed of two housing members 20 and 22, secured together with a pair of flanges 24 at the perimeter of each housing member 20 and 22. A pair of pedestals 26 are shown as projecting into the interior of the housing 14 from the upper housing member 20 (as viewed in the FIGURE) and contacting the back side of each flip chip 12. While shown as being integrally formed with the upper housing member 20, the pedestals 26 could be separately formed and subsequently attached to the housing member 20. A number of convection cooling fins 28 are shown as projecting outwardly from the upper housing member 20. The lower housing member 22 (as viewed in the FIGURE) encloses a pair of biasing members 30 that support the substrate 16. As depicted in the FIGURE, the biasing members 30 contact the interior wall of the lower housing member 22 so as to be braced for engagement with the substrate 16. The biasing members 30 can be any suitable elements, such as elastomeric members or springs, though it is foreseeable that other biasing elements could be used.

From the structure described above, it can be seen that the biasing members 30 serve to bias the flip chips 12 into engagement with the pedestals 26, so that the pedestals 26 are able to conduct heat away from the flip chips 12 and into the housing 14. For this reason, at least the pedestals 26 and fins 28 are preferably formed of a material that readily conducts heat, such as a metal or a metal-filled plastic. To facilitate manufacturing, the entire upper housing member 20, including integrally-formed pedestals 26 and fins 28, can be molded, stamped or formed from a conductive material, such as aluminum. While the lower housing member 22 need not be formed of a heat-conducting material in the embodiment shown, it is foreseeable to do so to provide a larger heatsink. The lower housing member 22 can also be equipped with cooling fins to further promote heat dissipation to the environment. The choice of material for the lower housing member 22 depends in part on the type of biasing member 30 used, since a metallic spring would promote conduction of heat back to the flip chip 12 if the lower housing member 22 is also thermally conductive.

The load applied by the biasing members 30 to the flip chips 12 affects the heat transfer across the interface between the chips 12 and their pedestals 26, with higher loads promoting conduction. However, the applied load must not be so high as to be structurally detrimental to the chips 12 and substrate 16. Generally, it is believed that a load of about three to five pounds (about 13 to about 22 Newtons) is acceptable, though lower and higher loads are foreseeable. To further promote heat transfer between the chips 12 and pedestals 26, the substrate 16 preferably is sufficiently flexible to accommodate variations in pedestal height and flip chip planarities to achieve uniform contact between the chips 12 and pedestals 26.

As shown in the FIGURE, a thermally-conductive lubricant 32 is also preferably provided between the back side of each flip chip 12 and their respective pedestals 26 to promote heat transfer therebetween. The lubricant 32 also serves to decouple any lateral mechanical strains that may arise as a result of different thermal expansions and movement between the flip chips 12, substrate 16 and pedestals 26. Various lubricants are known for this purpose, with a suitable lubricant being a silicone grease available from Dow Chemical. It is foreseeable that other heat-conducting materials having suitable lubricating properties could be used.

While our invention has been described in terms of a preferred embodiment, it is apparent that other forms could be adopted by one skilled in the art. For example, each of the components of the assembly 10 could be configured differently from that shown in the FIGURE. Furthermore, appropriate materials could be substituted for those noted. Accordingly, the scope of our invention is to be limited only by the following claims.

What is claimed is:

1. A method for conducting heat from a flip chip, the method comprising the steps of:

providing a flexible substrate having conductors thereon;

mounting a flip chip to the substrate, the flip chip having a first surface, solder bumps on the first surface, and a second surface oppositely disposed from the first surface, the flip chip being mounted to the substrate such that the solder bumps are registered with the conductors on the substrate; and enclosing the substrate and the flip chip within a housing so that a heat-conductive member contacts the second surface of the flip chip, and so that the substrate is contacted by a compressible member that biases the flip chip against the heat-conductive member so as to maintain thermal contact between the flip chip and the heat-conductive member.

2. A method as recited in claim 1, further comprising the step of placing a thermally-conductive lubricant between the second surface of the flip chip and the heat-conductive member.

3. A method as recited in claim 1 wherein the heat-conductive member is formed as a pedestal projecting from the housing and contacting the second surface of the flip chip.

4. A method as recited in claim 3, wherein the substrate, the flip chip, the pedestal and the compressible member are enclosed within the housing.

5. A method as recited in claim 1, wherein the compressible member is formed as an elastomeric pedestal engaged with the housing.

6. A method as recited in claim 1, wherein the substrate is chosen from the group consisting of laminates and printed wiring boards.

* * * * *